United States Patent
Kunieda et al.

(10) Patent No.: US 6,337,105 B1
(45) Date of Patent: Jan. 8, 2002

(54) METHOD AND APPARATUS FOR FORMING THIN FUNCTIONAL FILM

(75) Inventors: Toshiaki Kunieda, Minoo; Toshibumi Kamiyama, Tsuyama; Sadayuki Okazaki, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/462,580

(22) PCT Filed: Jul. 13, 1998

(86) PCT No.: PCT/JP98/03125

§ 371 Date: Jan. 11, 2000

§ 102(e) Date: Jan. 11, 2000

(87) PCT Pub. No.: WO99/04057

PCT Pub. Date: Jan. 28, 1999

(30) Foreign Application Priority Data

Jul. 14, 1997 (JP) .............................................. 9-188079

(51) Int. Cl.[7] .......................... C23C 14/24; C23C 14/12; C23C 14/28

(52) U.S. Cl. .............................. 427/248.1; 427/255.14; 427/255.6; 427/294; 427/595; 427/596; 118/723 VE; 118/724; 118/726; 118/620; 118/50.1

(58) Field of Search ................................. 427/596, 595, 427/294, 255.6, 255.14, 248.1; 118/50.1, 620, 723 VE, 726, 724

(56) References Cited

U.S. PATENT DOCUMENTS

| | | | |
|---|---|---|---|
| 2,435,997 A | | 2/1948 | Bennett |
| 3,570,449 A | * | 3/1971 | Blecherman et al. .......... 118/9 |
| 3,927,638 A | * | 12/1975 | Sakaue ...................... 118/49.1 |
| 4,015,029 A | * | 3/1977 | Elchisak ...................... 427/76 |
| 4,340,655 A | * | 7/1982 | Hollister et al. ............... 430/14 |
| 5,085,166 A | * | 2/1992 | Oka et al. ................... 118/50.1 |
| 5,190,800 A | | 3/1993 | Yamada et al. |

FOREIGN PATENT DOCUMENTS

| | | |
|---|---|---|
| EP | 0 295 144 | 12/1988 |
| FR | 2 232 077 | 12/1974 |
| FR | 2 235 401 | 1/1975 |
| GB | 1473535 | * 5/1977 |
| JP | 39-17440 | 8/1964 |
| JP | 59-126775 | * 7/1984 |
| JP | 60-69834 | 4/1985 |
| JP | 62-77455 | 4/1987 |
| JP | 63-18053 | 1/1988 |

(List continued on next page.)

OTHER PUBLICATIONS

Nakatani Mitsuo, "Method and Device for Forming Protectional Film", Apr. 10, 1986, Publication No. 61069960, abstract.

Donghong Gu et al., "Optical Recording Performance of Thin Films of Phthalocyanine Compounds", Feb. 15, 1995, Thin Solid Fildms, pp. 88–93.

Primary Examiner—Shrive Beck
Assistant Examiner—Michael Barr
(74) Attorney, Agent, or Firm—Wenderoth, Lind & Ponack, L.L.P.

(57) ABSTRACT

There is provided a method of forming a thin functional film by vacuum vapor deposition in which a functional material is heated from the above thereof so that bumping or splashing of the functional material is not caused upon evaporation of the functional material. Specifically, the functional material is placed in a receiving vessel and the functional material is heated by a heater which is located above the functional material so that bumping or splashing is suppressed, whereby a uniform functional film is produced without a pinhole.

22 Claims, 3 Drawing Sheets

* cited by examiner

FOREIGN PATENT DOCUMENTS

| | | | | | |
|---|---|---|---|---|---|
| JP | 6-179959 | 6/1994 | JP | 8-13572 | 2/1996 |
| JP | 7-62249 | 7/1995 | JP | 8-158044 | 6/1996 |
| | | | JP | 9-111441 | 4/1997 |
| | | | JP | 10-25563 | *1/1998 |

A

B

C

D

METHOD AND APPARATUS FOR FORMING THIN FUNCTIONAL FILM

FIELD OF THE INVENTION

The present invention relates to a method and apparatus of forming a thin functional film. In the present invention, the thin functional film is intended to mean one of various materials (for example an organic compound) in the form of a thin film attached onto an object by vapor deposition for the purpose of providing one of various functions such as recording information, displaying information, adjusting or changing of an optical property, converting energy and the like. Particularly, the following thin films are exemplified: a thin film information recording layer comprising an organic dye (or pigment) material which is formed on a substrate of an optical recording medium; a thin film of a sensitization material for a photoelectric conversion element which is formed on a substrate of a solar cell panel; and a charge transportation layer of an OPC (optical photo conductivity) material on a photoconductor drum.

BACKGROUND ART

Presently, various functional films are used widely for information recording elements (such as an optical recording medium and a photoconductor drum), information displaying elements (such as a color filter and a thin electroluminescence panel) as well as energy conversion elements (such as a solar cell) and medical diagnosis elements. Those functional films are all formed by a wet method such as spin coating or a dry method such as vacuum vapor deposition or sputtering.

Particularly, one example of optical recording mediums that has been recently noted is the recordable optical disk (CD-R), in which an information recording layer is formed on a substrate using an organic dye material since signals are conveniently read out from the organic dye material using a CD player or a CD-ROM drive. Hitherto, the recording layer has been formed by a wet method in which a solution of the organic dye material is applied onto the substrate by spin-coating followed by drying. In order to produce a satisfactory optical recording medium, know-how and skills are required since tolerable ranges of production are narrow.

On the other hand, the dry method of forming the recording layer has been also attempted in which vacuum vapor deposition is used so as to relatively easily produce a thin functional film having uniform thickness and uniform optical properties. For example, Japanese Patent Kokoku Publication No. 8-13572 disclosed an optical recording medium which is produced by heating a molybdenum boat containing a phthalocyanine based organic dye material so as to evaporate the material, and depositing the evaporated material onto a substrate surface to form a thin film of the organic dye material as a recording layer on the substrate. Further, an example of an apparatus which carries out such vapor deposition is disclosed in Japanese Patent Kokoku Publication No. 7-62249.

DISCLOSURE OF THE INVENTION

However, the vacuum vapor deposition as described above has a problem in that bumping and splashing often occur when the organic dye material in the boat is heated, which likely creates defects in the formed thin film due to inclusion of pinholes in the thin film. Such a problem should be resolved in order to make the deposition method industrially effective. Such a problem is not limited to the case in which the information recording layer is formed by the vacuum vapor deposition. Furthermore, it is a common problem in cases in which various materials are evaporated and deposited onto objects for the formation of various thin functional films.

It is an object of the present invention to provide a method and an apparatus for forming a uniform thin functional film having fewer defects so as to alleviate and preferably substantially overcome such a problem. It is noted that although the method and the apparatus according to the present invention are explained as examples with reference to a case in which a recording layer as the thin functional film is formed by depositing a dye material onto a substrate for an optical recording medium, the present invention is applicable to the formation of the other various thin functional films.

In the present invention which achieves the above mentioned object, a material, from which a thin functional film is formed (which is also referred to as a "functional material"), is placed preferably in an evaporation vessel and heated under a reduced pressure (preferably at a highly vacuum pressure) so as to evaporate the material, and the evaporated material is deposited onto an object, such as a substrate, so that a thin functional film is formed thereon, characterized in that the functional material is heated and evaporated from above, whereby the thin functional film is formed on the substrate.

According to the present invention, a thin functional film having a high quality is formed with notably reduced defects such as pinholes.

That is, the present invention provides a method for forming a thin functional film by evaporating a functional material under a reduced pressure condition and depositing the evaporated material onto an object, characterized in that the functional material is placed preferably in an evaporation vessel and heated from a position above the functional material so that the functional material is evaporated.

In addition, the present invention provides an apparatus for forming a thin functional film by evaporating a functional material under a reduced pressure condition and depositing the evaporated material onto an object, characterized in that the apparatus comprises an evaporation vessel which receives the functional material from which the thin functional film is formed, and a heating means which heats the functional material from a position above the functional material placed in the evaporation vessel.

Figure 1:
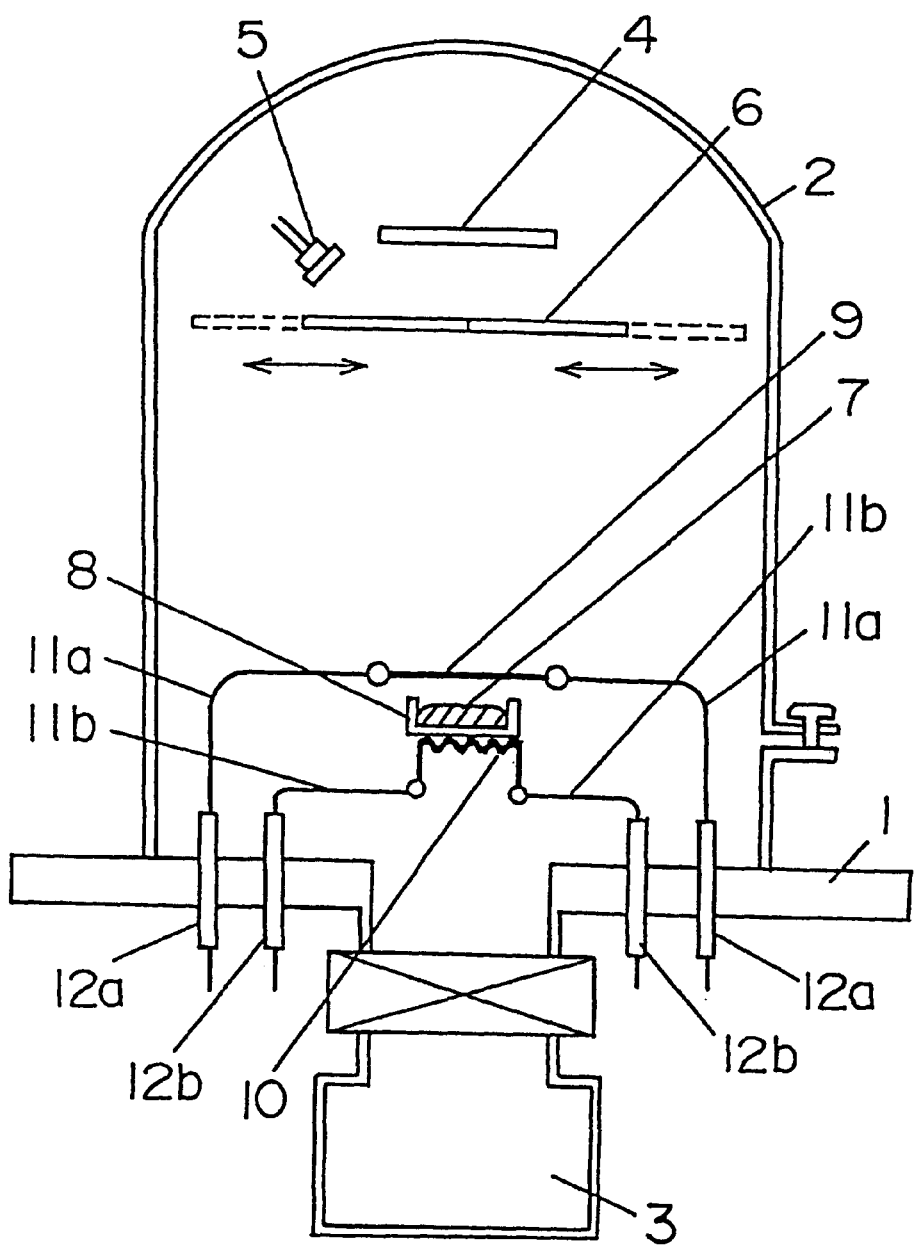
FIG. 1 schematically shows an apparatus for forming a functional film according to the first embodiment of the present invention.

In the drawings, the reference numbers represent the following corresponding members:

1 . . . base plate, 2 . . . vacuum chamber, 3 . . . vacuum pump, 4 . . . substrate, 5 . . . film thickness monitor, 6 . . . shutter, 7 . . . functional material, 8 . . . receiving vessel, 9 . . . upper heater, 10 . . . supplemental heater, . . . 11 . . . lead wire, 12 . . . electrode insert terminal, 13 . . . light beam introduction cylinder, 14 . . . introduction glass window, 15 . . . light beam source, 16 . . . light collecting mechanism, 17 . . . optical recording layer, 18 . . . reflecting layer, 19 . . . protection layer.

DETAILED DESCRIPTION OF THE INVENTION

The present invention essentially resides in heating a functional material, which is to be formed into a thin functional film, from above of the functional material, whereby a temperature across the upper portion of the functional material is higher than a temperature of the portion of functional material located below the upper portion. By continuing such heating, the temperature of the upper portion becomes the highest, so that the functional material successfully evaporates from its upper portion, and consequently the functional material evaporates without bumping or splashing.

Contrary to the above, in the conventional method in which an evaporation vessel itself is heated, the functional material in the evaporation vessel is heated such that a temperature of the inside portion, or the bottom portion, of the functional material becomes higher than a temperature of the upper portion. Consequently the material inside, or the material in lower portion, preferentially evaporates because it has a higher temperature compared to the upper portion. As a result, the evaporated material (namely, evaporated molecules) passes upward through the upper portion of the functional material, which is at the lower temperature, thereby causing bumping and splashing.

Upon the formation of the thin functional film according to the present invention, heating may be carried out under any proper conditions (a heating temperature, and an operation pressure during heating) depending on the thin functional film to be formed, and thus depending on the functional material. Generally, heating is carried out under a reduced pressure condition, and usually under a high vacuum. For example, the production of an optical recording medium (such as CD-R, DVD-R or the like) may be carried out, for example, at a temperature between 100° C. and 500° C. under an operation pressure of not more than $10^{-3}$ torr (concretely 250° C. and $10^{-4}$ torr). Further, the production of a photoconductor drum may be carried out, for example, at a temperature between 100° C. and 500° C. under an operation pressure between $10^{-3}$ torr and $10^{-7}$ torr.

The functional material is selected depending on the intended thin functional film. For example, for the production of the optical recording medium, the functional material may be an organic dye material such as a metal containing azo based dye material, a phthalocyanine based dye material or the like. Further, for the production of the photoconductor drum, the functional material may be a phthalocyanine. The functional material may be in any form. Before being heated, the material is usually in the form of powder consisting of fine particles, but it may be in a lump form.

The object onto which the thin functional film is formed may be any object depending on the application of the thin functional film. In the case of the production of the optical recording medium, the object may be a plastic (for example a polycarbonate) substrate which is permeable to the light. Further, in the case of the production of the photoconductor drum, the object may be an aluminum substrate.

It is noted that the thin functional film is intended to mean a film which is relatively thin and which exhibits a predetermined function, and its thickness is not particularly limited. For example, the thickness of the thin functional film may be in the range between about 0.01 $\mu$m and about 10 $\mu$m.

The evaporation vessel in which the functional material is placed may be made of any material and in any structure as far as it receives the functional material and the material is heated from above. For example, the vessel may be in a boat form, a crucible form, or the like, which is made of metal or ceramic. Generally, an upper (or top) portion of the vessel is at least partly open and most preferably substantially completely open. It is preferable that the vessel does not disturb movement (for example going up) of the material evaporated through heating (namely, the evaporated molecules) from the vessel toward the object.

The means to heat the functional material is not particularly limited as far as it heats the functional material from a position above the material. Particularly, an electric heater, which is located above the evaporation vessel, a photo energy supplying means (such as a light beam source), which is so located that it heats the upper portion of the evaporation vessel, and a heating source, which irradiates radiant energy are exemplified, and these means may be combined. Further, a supplemental (or auxiliary) heating means, which preheats the functional material up to a temperature at which no evaporation of the functional material occurs, may be combined with the heating means, which heats the functional material from above. Such a supplemental heating means may be any one conventionally used, and it may be, for example, means which heats the evaporation vessel itself Exemplary embodiments of the present invention will be explained hereinafter with reference to the accompanying drawings.

Figure 2:
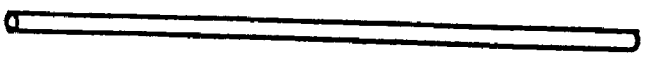
FIGS. 2A–2D schematically show exemplary forms of an upper heater according to the first embodiment of the present invention.
Figure 2:
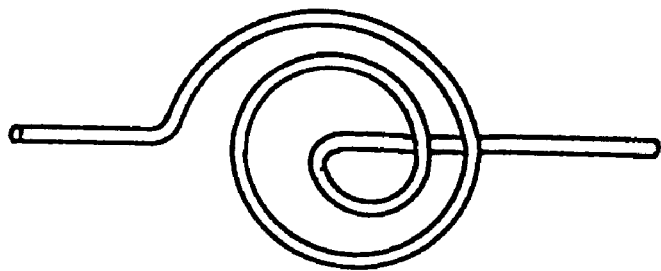
Figure 2:
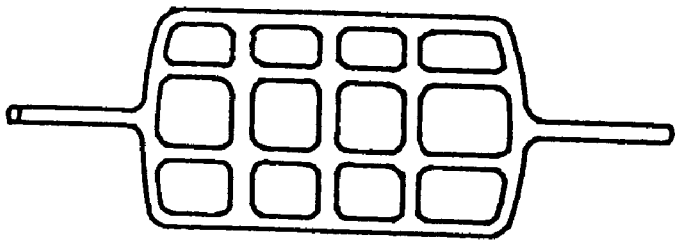
Figure 2:
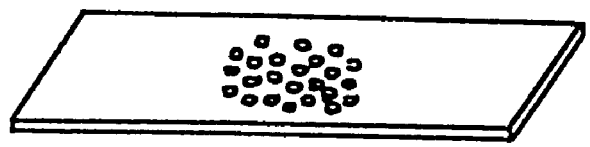
Figure 3:
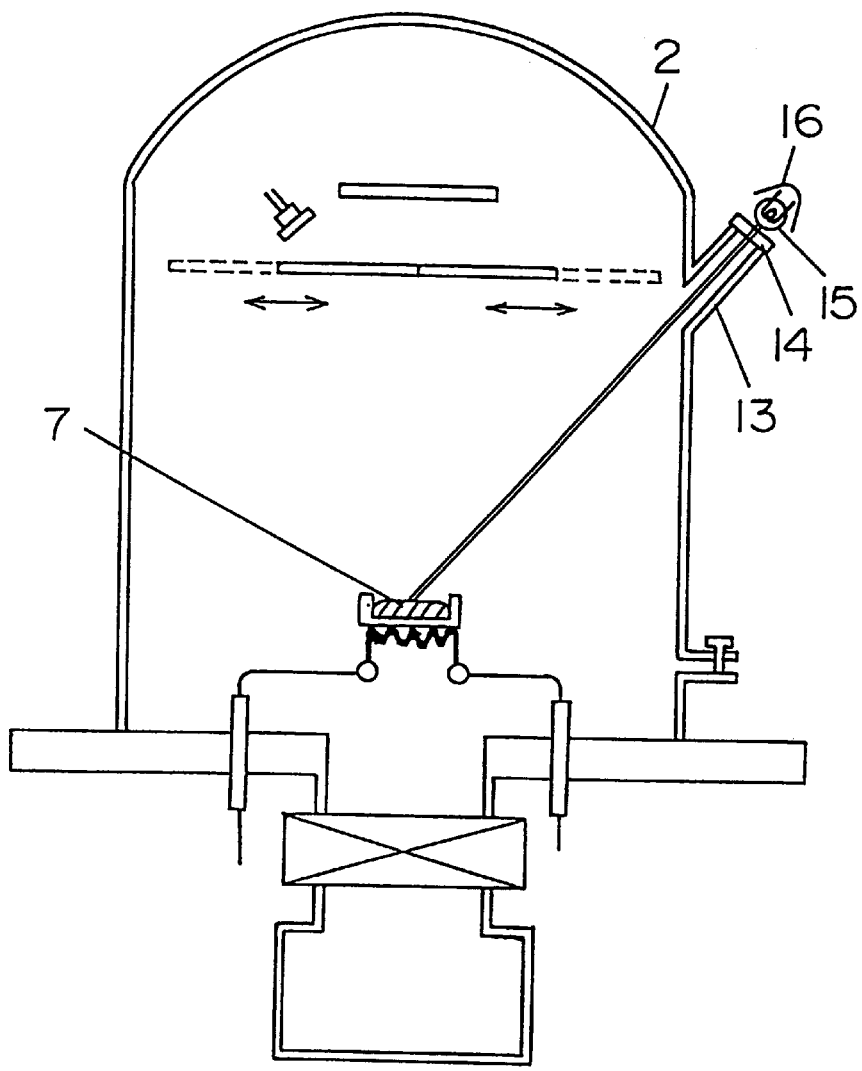
FIG. 3 schematically shows an apparatus for forming a functional film according to the second embodiment of the present invention.
Figure 4:
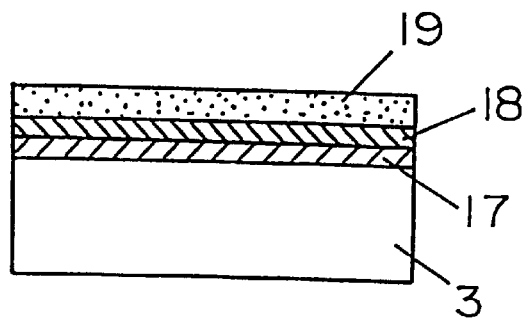
FIG. 4 schematically shows a cross-sectional view of an optical recording medium along a direction which is perpendicular to a substrate of the medium.

FIGS. 1 and 3 schematically show apparatus for the formation of the thin functional film according to the present invention, FIG. 2 schematically shows various heating means, and FIG. 4 schematically shows in a cross-sectional view, a standard structure of the optical recording medium produced in Examples.

Embodiment 1

FIG. 1 is a schematic cross-sectional side view of a first embodiment of the apparatus for the production of the thin functional film according to the present invention. The apparatus is for forming the thin functional film, which functions as a recording layer, on the substrate for an optical recording medium. The apparatus comprises a base plate (1) and a vacuum chamber (2) in the form of a bell jar made of a transparent glass placed on the plate. The vacuum chamber (2) is evacuated by a vacuum pump (3) such as a diffusion pump, a cryo-pump, a turbo molecular pump, or the like, so that the inside of the vacuum chamber is kept at a high vacuum.

A substrate (4) onto which the thin functional film is to be formed, a monitor (5) which detects a thickness of the deposited film and a shutter, (6) which interrupts the movement of the evaporated molecules toward the substrate (shown in a closed state), are provided in the upper portion of the vacuum chamber (2). An evaporation vessel (8) which contains the functional material, an upper heating means (9), and a supplemental heating means (10) are provided in the lower portion of the vacuum chamber (2). A distance between the substrate (4) and the evaporation vessel (8) is about 20 to 30 cm, and a distance between the substrate (4) and the shutter (6) is about 3 to 5 cm. The upper heating means (9) and the supplemental heating means (10) may be electrical heating means. As clearly seen from the drawing, the upper heating means (9) is placed above the functional material (7), so that it preferentially heats the upper portion of the functional material, whereas a portion, which is below the upper portion, is heated by heat conduction from the upper portion of the heated functional material.

The thickness monitor (5) is a conventional one of a quartz oscillator type. The substrate (4) is made of a plastic material such as a polycarbonate, a polyolefin, a polymethyl methacrylate, or the like.

The functional material (7) is an organic dye (or pigment) material such as a phthalocyanine, naphthalocyanine, squarylium, croconium, pyrylium, naphthoquinone, anthraquinone, xanthene, triphenylmethane, azulenium, tetrahydrocholine, phenanthrene, triphenothiazine, polymethine, azo based dye material.

The shape of the evaporation vessel (8) is not particularly limited, as long as the evaporated molecules are able to leave the evaporation vessel toward the substrate, (4) which is placed above the vessel. It is generally preferable that at least a portion of a top of the vessel is open (for example, a boat form). The evaporation vessel (8) may be made of metal or ceramic, and it is required to be heat resistant at a temperature of about 500° C., and to not generate adverse gas (i.e. impurity gas or outgas) during heating. When a ceramic, for example of which thermal conductivity is lower than that of a metal, is used, thermally effective deposition is possible.

The upper heating means (9) may be a heater, which heats electrically and which is made of a metal having a high melting point such as tantalum, molybdenum, tungsten or the like. It is preferable that the material for the heater has a large thermal emissivity. The heater may have any suitable shape. Specifically, the heaters shown in FIG. 2 may be used.

FIG. 2A is a conventional wire type heater, FIG. 2B is a spiral type heater in which the wire type heater is coiled into the spiral form, FIG. 2C is a net (or mesh) type heater, which has a plurality of large openings, and FIG. 2D is a perforated heater, which has a plurality (preferably a large number) of pores through a plate. Among them, the plate type porous heater D is good in the evaporation efficiency.

The supplemental heating means (10) comprises a Nichrome wire heater, that is designed to prevent outgas generation during heating. The supplemental heater may preheat the functional material up to a temperature just before the evaporation of the material begins, or to suppress the functional material's temperature from decreasing after the evaporation has started.

Each heater is connected to electrode insert terminals 12a or 12b through lead wires 11a or 11b. The terminals are connected to a power source (direct current or alternating current, not shown) for heating outside the apparatus.

Using the apparatus for the formation of the thin functional film as described above, a thin functional film forming method is carried out as described below.

First, an organic dye material as the functional material (7) is placed into the evaporation vessel (8), the substrate (4) is placed in the upper portion of the vacuum chamber, and the shutter (6) is closed as shown. The vacuum chamber (2) is placed on the base plate (1) and evacuated to a pressure of, for example, $1\times10^{-5}$ torr.

Then, current is passed through the upper heater (9) and the organic dye material is heated from above. When the current is increased, the evaporation of the organic dye material starts from its top portion.

Thereafter, the shutter (6) is opened and the thin film is formed on the substrate (4). During formation, a thickness of the deposited film is detected by the thickness monitor (5), and when the thin functional film having a predetermined thickness has been produced, the shutter is closed. An opening period of the shutter is, for example, about one minute.

Upon heating the organic dye material, when the supplemental heater is used to heat the organic dye material to a point just prior to when evaporation occurs, before heating with the upper heater (9), the evaporation initiation period is shortened. Consequently, the evaporation rate is increased, so that more efficient deposition is possible in a shorter period.

In a case in which the organic dye material is in the form of fine particles, when the organic dye material is heated from its lower portion by using only the supplemental heater (10), heat conduction from the organic dye material in the lower portion to the organic dye material particles, which are located above the former particles is degraded because of the presence of vacuum spaces between the particles. As a result, a temperature difference occurs between the upper portion and the lower portion of the organic dye material. Therefore, since the evaporated molecules at a higher temperature enter the upper portion of the organic dye material at a lower temperature, bumping and splashing are likely to occur.

Embodiment 2

The apparatus of a second embodiment according to the present invention shown in FIG. 3 is similar to the above mentioned embodiment 1 except that the apparatus comprises a light beam source (15) equipped with a light beam introduction cylinder (13), a light passing glass window (14) and a light collecting mechanism (16) instead of the upper heater (9).

The light beam source (15) supplies optical energy to the upper portion of the organic dye material (7) in the vacuum vessel (2) from the outside thereof For example, a halogen lamp is used for the light beam source. In order to efficiently use generated optical energy, the light beam source (15) is combined with the light collecting mechanism (16) comprising a concave mirror. The light generated by the light beam source (15) irradiates the top portion of the functional material (7), and its energy heats the top portion of the functional material (7). It is noted that the light passing glass window (14) is made of, for example, a quartz glass having decreased light absorption. The light beam introduction cylinder (13) is provided on the vacuum chamber (2) by additionally processing.

In addition, in place of the light beam source having the light collecting mechanism, a laser light source may be of course used for heating the top portion of the functional material.

The method for forming the thin functional film in which the optical energy is used for heating as in the above case can be carried out substantially similar to the above mentioned embodiment 1 except that heating of the functional material (7) is carried out by the light beam source (15).

INDUSTRIAL APPLICABILITY OF THE INVENTION

As described above, according to the present invention, by heating the functional material from above during formation of the thin functional film on the object, bumping and splashing of the functional material are suppressed so that a uniform thin functional film is formed on the object without defects.

EXAMPLES

Next, the present invention will be further explained specifically by examples, in which the thin functional is formed from the organic dye material on the substrate for the optical recording medium.

In the examples, an optical recording layer made of a phthalocyanine based functional material and having a thickness of 0.15 μm was formed on a polycarbonate substrate having a thickness of 1.2 mm (an evaporation starting temperature of the functional material was 300° C., and a vacuum pressure was $5\times10^{-5}$ torr), and then a gold reflecting layer having a thickness of 0.1 μm was formed on the recording layer by sputtering. Thereafter, the substrate was taken out of the vacuum chamber and a protection layer (4) made of a ultra-violet curable resin having a thickness of 5 μm was formed on the reflecting layer by the spin coating method so that the optical recording medium (CD-R) was obtained.

FIG. 4 schematically shows a cross-sectional view of the optical recording medium thus obtained. The optical recording medium comprises the optical recording layer (17) of the phthalocyanine based material on the polycarbonate substrate (3) having a spiral groove thereon, and the reflecting layer of gold (18) as well as the protection layer (19) of the UV curable resin on the recording layer (17).

Example 1

Using the apparatus as shown in FIG. 1 and passing a direct current of 70 A through the upper heater (9), the phthalocyanine based dye material placed in the evaporation vessel (8) (of a boat type, molybdenum made) was heated from its above without using the supplemental heater (10), so that the dye material was evaporated and deposited onto the substrate, whereby the thin film of the dye material was formed. Thirty optical recording mediums were totally prepared.

Example 2

Example 1 was repeated so as to form the thin film of the dye material on the substrate except that using the apparatus as shown in FIG. 3 and applying a power of 200 W to the light beam source (15), so that the phthalocyanine based functional material was heated from above. Thirty optical-recording mediums were totally prepared.

Comparative Example

Example 1 was repeated so as to form the thin film of the dye material on the substrate except that the upper heater (9) was not used, but only the supplemental heater (10) was used to heat the phthalocyanine based dye material while applying a power of 150 W thereto. Thirty optical recording mediums were totally prepared.

With respect to each of the optical recording mediums produced as described above, a bit error rate was measured, and the number of pinholes having a size of not smaller than 30 μm was counted, and then the number of discs of which pinhole number was more than ten (which is a standard) was counted.
(1) Bit error rate The bit error rate is the number of byte errors per second. Error occurring frequency of one byte corresponds to a bit error rate of $5.6\times10^{-6}$ when constituting with 176400 bytes/sec.
(2) Pinhole The number of pinholes are counted visually while irradiating a light from a back side of the disc.

As a result, the optical recording mediums obtained in Example 1 had an average bit error rate of $2.0\times10^{-5}$ and the number of discs of which the pinhole number was above the standard was one.

The optical recording mediums obtained in Example 2 had an average bit error rate of $1.0\times10^{-5}$ and the number of discs of which the pinhole number was above the standard was zero.

The optical recording mediums obtained in Comparative Example had an average bit error rate of $22.0\times10^{-5}$ and the number of discs of which the pinhole number was above the standard was sixteen.

Based on the above results, when the phthalocyanine based dye material was heated from above and evaporated so as to form the thin film of the dye material on the substrate, the uniform optical recording medium is obtained of which thin film has fewer pinholes, so that qualities such as a bit error rate are improved.

The present invention has been explained particularly and specifically with reference to the production of the optical recording medium comprising the recording layer of the organic dye material as the thin functional film on the plastic substrate, but the present invention is similarly applicable to cases in which other thin functional films are formed on other objects.

What is claimed is:

1. A method for forming a functional film on an object, said method comprising:

providing a functional material comprising an organic dye material;

heating and evaporating the functional material under a reduced pressure, said heating comprising heating the functional material from above; and separately and supplementally heating the functional material to a temperature below an evaporation temperature of the functional material.

2. The method according to claim 1, wherein said providing of the functional material comprises providing the functional material in an evaporation vessel.

3. The method according to claim 2, wherein the object is a substrate for an optical recording medium, and the functional film is a recording layer.

4. The method according to claim 1, wherein the object is a substrate for an optical recording medium, and the functional film is a recording layer.

5. The method according to claim 2, wherein said heating of the functional material comprises heating the functional material witha heater located above the evaporation vessel.

6. The method according to claim 5, wherein the object is a substrate for an optical recording medium, and the functional film is a recording layer.

7. The method according to claim 1, wherein said heating of the functional material comprises heating the functional material with an optical energy irradiator that irradiates an upper portion of the functional material.

8. The method according claim 7, wherein the optical energy irradiator is a light beam source comprising a light collecting mechanism or a laswer light source.

9. The method accroding to claim 8, wherein the object is a substrate for an optical recording medium, and the functional film is a recording layer.

10. The method according to claim 7, wherein the object is a substrate for an optical recording medium, and the functional film is a recording layer.

11. An apparatus for forming a functional film on an object by heating and evaporating a functional material which forms the functional film under a reduced pressure, said apparatus comprising:

an evaporation vessel operable to receive the functional material;

an electric plate heater having a plurality of through holes, said electric plate heater positioned so as to heat the functional material from above when the functional material is received in said evaporation vessel.

12. The apparatus according to claim 11, wherein said heater is located above the evaporation vessel.

13. The apparatus according to claim 12, wherein the object is a substrate for an optical recording medium, and the functional film is a recording layer.

14. The apparatus according to claim 11, further comprising a supplemental heater that heats said evaporation vessel to a temperature below an evaporation temperature of the functional material.

15. The apparatus according to claim 14, wherein the object is a substrate for an optical recording medium, and the functional film is a recording layer.

16. The apparatus according to claim 11, wherein the object is a substrate for an optical recording medium, and the functional film is a recording layer.

17. A method for forming a functional film on an object, said method comprising:

providing a functional material comprising an organic dye material; and heating and evaporating the functional material under a reduced pressure, said heating comprising heating the functional material from above with an electric plate heater having a plurality of through holes.

18. The method according to claim 17, wherein said providing of the functional material comprises providing the functional material in an evaporation vessel.

19. The method according to claim 18, wherein the object is a substrate for an optical recording medium, and the functional film is a recording layer.

20. The method according to claim 17, wherein the object is a substrate for an optical recording medium, and the functional film is a recording layer.

21. The method according to claim 18, wherein said heating of the functional material further comprises heating the functional material with the electric plate heater, wherein the electric plate heater is located above the evaporation vessel.

22. The method according to claim 21, wherein the object is a substrate for an optical recording medium, and the functional film is a recording layer.

* * * * *